United States Patent
Hoshino et al.

(10) Patent No.: US 11,111,592 B2
(45) Date of Patent: Sep. 7, 2021

(54) MANUFACTURING APPARATUS AND MANUFACTURING METHOD FOR SEMICONDUCTOR DEVICE

(71) Applicant: Tokyo Electron Limited, Tokyo (JP)

(72) Inventors: Tomohisa Hoshino, Koshi (JP); Masato Hamada, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 174 days.

(21) Appl. No.: 15/780,303

(22) PCT Filed: Nov. 22, 2016

(86) PCT No.: PCT/JP2016/084655
§ 371 (c)(1),
(2) Date: May 31, 2018

(87) PCT Pub. No.: WO2017/094568
PCT Pub. Date: Jun. 8, 2017

(65) Prior Publication Data
US 2018/0355501 A1    Dec. 13, 2018

(30) Foreign Application Priority Data
Dec. 3, 2015  (JP) .............................. JP2015-236353

(51) Int. Cl.
*C25D 17/02* (2006.01)
*C25D 5/18* (2006.01)
(Continued)

(52) U.S. Cl.
CPC ................ *C25D 5/18* (2013.01); *C25D 5/00* (2013.01); *C25D 7/12* (2013.01); *C25D 17/001* (2013.01);
(Continued)

(58) Field of Classification Search
CPC ...... C25D 17/001; C25D 17/10; C25D 21/12; C25D 17/008; C25D 17/02; C25D 17/00; C25D 1/04
(Continued)

(56) References Cited

U.S. PATENT DOCUMENTS

| | | | | |
|---|---|---|---|---|
| 2015/0276835 A1* | 10/2015 | Minami | ................... | C25D 7/12 204/229.8 |
| 2016/0108538 A1* | 4/2016 | Iwatsu | ..................... | C25F 3/02 205/123 |
| 2016/0326663 A1 | 11/2016 | Iwatsu | | |

FOREIGN PATENT DOCUMENTS

| | | | |
|---|---|---|---|
| JP | 2000-208627 A | 7/2000 | |
| JP | 2003-528219 A | 9/2003 | |

(Continued)

OTHER PUBLICATIONS

International Search Report for PCT/JP2016/084655 dated Dec. 27, 2016.

*Primary Examiner* — Zulmariam Mendez
(74) *Attorney, Agent, or Firm* — Pearne & Gordon LLP

(57) ABSTRACT

A manufacturing apparatus for a semiconductor device includes a substrate holding unit configured to hold a substrate; a processing liquid supply unit configured to supply a processing liquid onto the substrate held by the substrate holding unit; an electrolytic processing unit disposed to face the substrate holding unit and configured to perform an electrolytic processing on the substrate held by the substrate holding unit; and a terminal configured to apply a voltage to the substrate. The electrolytic processing unit includes a direct electrode configured to be brought into contact with the processing liquid supplied onto the substrate to apply a voltage with respect to the substrate; and an (Continued)

indirect electrode configured to form an electric field in the processing liquid supplied onto the substrate.

13 Claims, 15 Drawing Sheets

(51) Int. Cl.
    *H01L 21/288*     (2006.01)
    *C25D 17/00*     (2006.01)
    *C25D 5/00*     (2006.01)
    *C25D 7/12*     (2006.01)
    *C25D 21/12*     (2006.01)
    *C25D 17/10*     (2006.01)
    *C25D 3/38*     (2006.01)

(52) U.S. Cl.
    CPC ......... *C25D 17/005* (2013.01); *C25D 17/007* (2013.01); *C25D 17/10* (2013.01); *C25D 21/12* (2013.01); *H01L 21/288* (2013.01); *C25D 3/38* (2013.01)

(58) Field of Classification Search
    USPC ...................................................... 204/230.7
    See application file for complete search history.

(56) References Cited

FOREIGN PATENT DOCUMENTS

| | | |
|---|---|---|
| JP | 2004-250747 A | 9/2004 |
| JP | 2010-013680 A | 1/2010 |
| WO | 01/71066 A1 | 9/2001 |
| WO | 2015/104951 A1 | 7/2015 |

* cited by examiner

MANUFACTURING APPARATUS AND MANUFACTURING METHOD FOR SEMICONDUCTOR DEVICE

TECHNICAL FIELD

Cross-Reference to Related Application

This application claims the benefit of Japanese Patent Application No. 2015-236353 filed on Dec. 3, 2015, the entire disclosures of which are incorporated herein by reference.

The various embodiments described herein pertain generally to a manufacturing apparatus for a semiconductor device and a manufacturing method for the semiconductor device using the manufacturing apparatus.

BACKGROUND ART

In a manufacturing process of a semiconductor device, an electrolytic processing such as a plating processing or an etching processing is performed.

Conventionally, a plating processing on a semiconductor wafer is performed by a plating apparatus shown in Patent Document 1, for example. In the plating apparatus, the semiconductor wafer is placed to face an anode electrode with a plating target surface thereof facing downwards. Further, a supporting unit configured to support the semiconductor wafer constitutes a cathode electrode connected to the semiconductor wafer. By supplying a plating liquid toward the plating target surface of the semiconductor wafer through the anode electrode, the plating processing is performed on the semiconductor wafer.

Further, the plating apparatus described in Patent Document 1 is equipped with an ultrasonic oscillator. By delivering an ultrasonic wave oscillated from the ultrasonic oscillator to the plating liquid, the plating liquid is agitated. Accordingly, uniformity of the plating processing is improved.

PRIOR ART DOCUMENT

Patent Document 1: Japanese Patent Laid-open Publication No. 2004-250747

DISCLOSURE OF THE INVENTION

Problems to be Solved by the Invention

In case of using the plating apparatus disclosed in Patent Document 1, however, the ultrasonic oscillator is required to agitate the plating liquid, so that a large-scale agitating device is needed. Because of a limit in the apparatus configuration, however, it may not be possible to provide such a large-scale agitating device in the plating apparatus.

In view of the foregoing, exemplary embodiments provide a technique capable of manufacturing a semiconductor device efficiently.

Means for Solving the Problems

In an exemplary embodiment, a manufacturing apparatus for a semiconductor device includes a substrate holding unit configured to hold a substrate; a processing liquid supply unit configured to supply a processing liquid onto the substrate held by the substrate holding unit; an electrolytic processing unit disposed to face the substrate holding unit and configured to perform an electrolytic processing on the substrate held by the substrate holding unit; and a terminal configured to apply a voltage to the substrate. The electrolytic processing unit includes a direct electrode configured to be brought into contact with the processing liquid supplied onto the substrate to apply a voltage with respect to the substrate; and an indirect electrode configured to form an electric field in the processing liquid supplied onto the substrate.

For example, assume that processing target ions contained in the processing liquid are positive ions. If the electric field (electrostatic field) is formed by applying the voltage to the indirect electrode, negatively charged particles are gathered at a side of the electrolytic processing unit (the indirect electrode and the direct electrode), and the processing target ions are moved to a side of the substrate. Then, by applying a voltage while using the direct electrode as an anode and the substrate as a cathode, electric current is flow between the direct electrode and the substrate. As a result, charges of the processing target ions moved to the substrate side are exchanged, so that the processing target ions are reduced.

Further, in case that the processing target ions are negative ions, the processing target ions are also moved to the substrate side if the electric field is formed in the processing liquid by applying the voltage to the indirect electrode. Then, by applying the voltage while using the direct electrode as a cathode and the substrate as an anode, electric current is flown between the direct electrode and the substrate. As a result, the charges of the processing target ions moved to the substrate side are exchanged, so that the processing target ions are oxidized.

According to the present exemplary embodiment, since the movement of the processing target ions by the indirect electrode and the oxidation or the reduction (hereinafter, simply referred to as "oxidation/reduction") of the processing target ions by the direct electrode and the substrate are performed individually, the oxidation/reduction of the processing target ions can be performed in the state that the processing target ions are sufficiently and uniformly accumulated on the surface of the substrate. Thus, the electrolytic processing can be performed on the surface of the substrate in the uniform manner. Besides, a large-scale device for agitating the plating liquid as in the prior art is not required to improve the uniformity of the electrolytic processing, so that the apparatus configuration can be simplified. Hence, the semiconductor device can be manufactured efficiently and appropriately.

In another exemplary embodiment, a manufacturing apparatus for a semiconductor device includes a substrate holding unit configured to hold a substrate; a processing liquid supply unit configured to supply a processing liquid onto the substrate held by the substrate holding unit; an electrolytic processing unit disposed to face the substrate holding unit and configured to perform an electrolytic processing on the substrate held by the substrate holding unit; and a terminal configured to apply a voltage to the substrate. The electrolytic processing unit comprises a main body made of an insulator; a common electrode provided on a surface of the main body, and configured to be brought into contact with the processing liquid supplied onto the substrate to apply a voltage with respect to the substrate and form an electric field in the processing liquid supplied onto the substrate; and a capacitor connected to the common electrode via a wiring.

In yet another exemplary embodiment, a manufacturing method for a semiconductor device includes a first process of placing a substrate holding unit configured to hold a substrate and an electrolytic processing unit configured to perform an electrolytic processing on the substrate held by the substrate holding unit to face each other; a second process of supplying a processing liquid from a processing liquid supply unit onto the substrate held by the substrate holding unit; a third process of bringing a terminal configured to apply a voltage to the substrate into contact with the substrate and brining a direct electrode belonging to the electrolytic processing unit into contact with the processing liquid; a fourth process of forming an electric field in the processing liquid by applying a voltage to an indirect electrode belonging to the electrolytic processing unit to move processing target ions in the processing liquid to a substrate side; and a fifth process of oxidizing or reducing the processing target ions moved to the substrate side by applying a voltage between the direct electrode and the substrate.

In still yet another exemplary embodiment, a manufacturing method for a semiconductor device includes a first process of placing a substrate holding unit configured to hold a substrate and an electrolytic processing unit configured to perform an electrolytic processing on the substrate held by the substrate holding unit to face each other; a second process of supplying a processing liquid from a processing liquid supply unit onto the substrate held by the substrate holding unit; a third process of bringing a terminal configured to apply a voltage to the substrate into contact with the substrate and brining a common electrode belonging to the electrolytic processing unit into contact with the processing liquid; a fourth process of forming an electric field in the processing liquid by applying a voltage to the common electrode to move processing target ions in the processing liquid to a substrate side; and a fifth process of oxidizing or reducing the processing target ions moved to the substrate side by applying a voltage between the common electrode and the substrate. The electrolytic processing unit further comprises a main body made of an insulator. The common electrode is provided on a surface of the main body, and a capacitor is connected to the common electrode via a wiring.

Effect of the Invention

According to the exemplary embodiments, it is possible to manufacturing a semiconductor device effectively and appropriately.

BRIEF DESCRIPTION OF THE DRAWINGS

FIG. 11A shows a configuration in which independent indirect electrodes are provided in multiple levels, FIG. 11B shows a configuration in which indirect electrodes are provided in a comb-teeth shape and FIG. 11C shows a configuration in which two comb-teeth-shaped indirect electrodes are alternately arranged.

DETAILED DESCRIPTION

Hereinafter, exemplary embodiments will be described with reference to the accompanying drawings. The following exemplary embodiments are not limiting.

Figure 1:
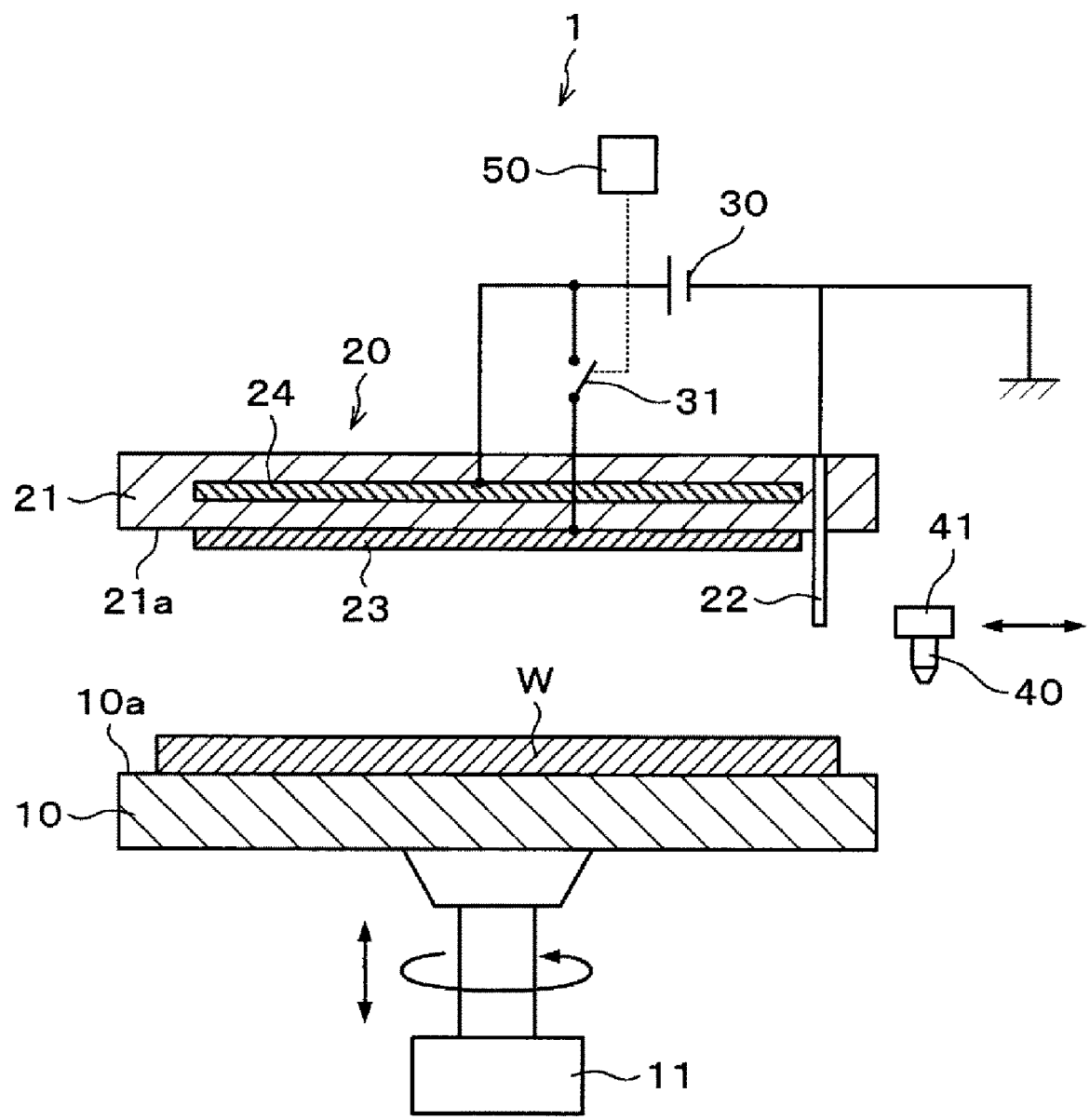
FIG. 1 is a diagram illustrating a schematic configuration of a manufacturing apparatus for a semiconductor device according to an exemplary embodiment.

FIG. 1 is a diagram illustrating a schematic configuration of a manufacturing apparatus 1 for a semiconductor device according to an exemplary embodiment. In the manufacturing apparatus 1, a plating processing is performed as an electrolytic processing on a semiconductor wafer W (hereinafter, referred to as "wafer W") which is used as a substrate. A seed layer (not shown) serving as an electrode is formed on a surface of the wafer W. Further, in the drawings recited in the following description, sizes of individual components do not necessarily correspond to actual sizes thereof for the purposes of easy understanding of the invention.

The manufacturing apparatus 1 is equipped with a wafer holding unit 10 as a substrate holding unit. The wafer holding unit 10 is a spin chuck configured to hold and rotate the wafer W. The wafer holding unit 10 has a surface 10a having a dimeter larger than a diameter of the wafer W when viewed from the top, and, for example, a suction opening (not shown) for attracting the wafer W is provided at the surface 10a. The wafer W can be attracted to and held on the wafer holding unit 10 by suctioning from this suction opening.

The wafer holding unit 10 is equipped with a driving mechanism 11 having, by way of example, a motor or the like, and the wafer holding unit 10 is configured to be rotated at a preset speed by the driving mechanism 11. Further, the driving mechanism 11 is provided with an elevation driving source such as a cylinder, and the wafer holding unit 10 is movable in a vertical direction. Further, in the present exemplary embodiment, the driving mechanism 11 constitutes the rotating mechanism and the moving mechanism in the present disclosure.

An electrolytic processing unit 20 is provided above the wafer holding unit 10, facing the wafer holding unit 10. The electrolytic processing unit 20 has a main body 21 made of an insulator. When viewed from the top, the main body 21 has a surface 21a which has a diameter larger than the diameter of the wafer W. The main body 21 is equipped with a terminal 22, a direct electrode 23 and an indirect electrode 24.

The terminal 22 is held at the main body 21 and protruded from the surface 21a of the main body 21. Further, the terminal 22 has elasticity. When the plating processing is performed, the terminal 22 is brought into contact with the wafer W (seed layer) and applies a voltage to the wafer W, as will be described later. Further, the number of the terminal 22 is not particularly limited. In the present exemplary embodiment, eight terminals are provided. Further, the terminals 22 need not necessarily be provided at the main body 21 and may be provided separately from the electrolytic processing unit 20.

The direct electrode 23 is provided on the surface 21a of the main body 21. When the plating processing is performed, the direct electrode 23 comes into contact with a plating liquid on the wafer W, as will be described later.

The indirect electrode 24 is provided within the main body 21. That is, the indirect electrode 24 is not exposed to the outside.

Each terminal 22, the direct electrode 23 and the indirect electrode 24 are connected with a DC power supply 30. The terminal 22 is connected to a cathode side of the DC power supply 30. The direct electrode 23 and the indirect electrode 24 are respectively connected to an anode side of the DC power supply 30. Further, a switch 31 configured to change a connection between the direct electrode 23 and the DC power supply 30 is provided between the direct electrode 23 and the DC power supply 30. An on/off operation of the switch 31 is controlled by a control unit 50. In the state that the switch 31 is on, the direct electrode 23 and the DC power supply 30 are connected with each other, and electric current flows between the direct electrode 23 and the terminal 22. Further, in the state that the switch 31 is off, the direct electrode 23 and the DC power supply 30 are disconnected from each other, so that the electric current does not flow between the direct electrode 23 and the terminal 22.

Provided between the wafer holding unit 10 and the electrolytic processing unit 20 is a nozzle 40 as a processing liquid supply unit configured to supply the plating liquid as a processing liquid onto the wafer W. The nozzle 40 is configured to be movable in the horizontal direction and the vertical direction by a nozzle moving mechanism 41, and is configured to be movable back and forth with respect to the wafer holding unit 10. Further, the nozzle 40 communicates with a plating liquid supply source (not shown) storing the plating liquid, and the plating liquid is supplied from the plating liquid supply source into the nozzle 40. By way of non-limiting example, a mixed solution prepared by dissolving copper sulfate and sulfuric acid is used as the plating liquid, and copper ions as processing target ions are included in the plating liquid. Further, in the present exemplary embodiment, though the nozzle 40 is used as the processing liquid supply unit, various other devices may be used to supply the plating liquid.

Furthermore, a recovery cup (not shown) may be provided around the wafer holding unit 10 to receive and collect the liquid scattered or falling from the wafer W.

The above-described manufacturing apparatus 1 is equipped with the control unit 50. The control unit 50 may be implemented by, for example, a computer and is equipped with a program storage unit (not shown). The program storage unit stores a program for controlling a processing on the wafer W in the manufacturing apparatus 1. The program is stored in a computer-readable recording medium such as a hard disk HD, a flexible disk FD, a compact disk CD, a magnet optical disk MO, a memory card, or the like, and may be installed to the control unit 50 from the recording medium.

Now, the plating processing in the manufacturing method using the manufacturing apparatus 1 having the above-described configuration will be discussed.

Figure 2:
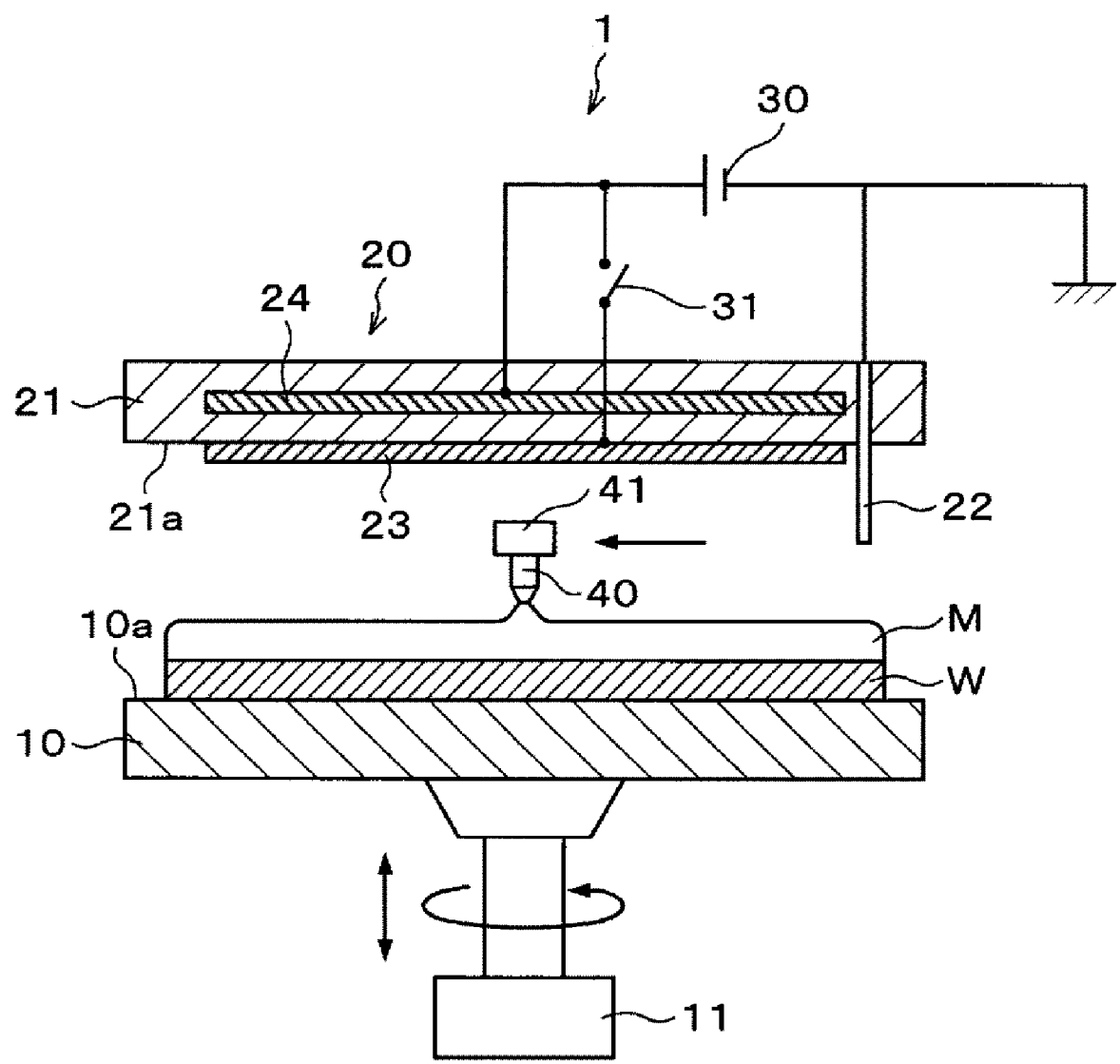
FIG. 2 is a diagram illustrating a state in which a liquid puddle of a plating liquid is being formed on a wafer.

First, as shown in FIG. 2, in the state that the wafer holding unit 10 and the electrolytic processing unit 20 are placed to face each other, the nozzle 40 is moved, by the nozzle moving mechanism 41, to a position above a central portion of the wafer W held by the wafer holding unit 10. At this time, a distance between the surface 10a of the wafer holding unit 10 and the surface 21a of the main body 21 of the electrolytic processing unit 20 is set to be about 100 mm. Thereafter, while rotating the wafer W by the driving mechanism 11, a plating liquid M is supplied onto the central portion of the wafer W from the nozzle 40. The supplied plating liquid M is diffused onto the entire surface of the wafer W by a centrifugal force. At this time, as the wafer W is rotated, the plating liquid M is diffused uniformly within the surface of the wafer W. Then, if the rotation of the wafer W is stopped after stopping the supply of the plating liquid M from the nozzle 40, the plating liquid M stays on the wafer W by a surface tension of the plating liquid M, so that a liquid puddle having a uniform film thickness is formed thereon.

Figure 3:
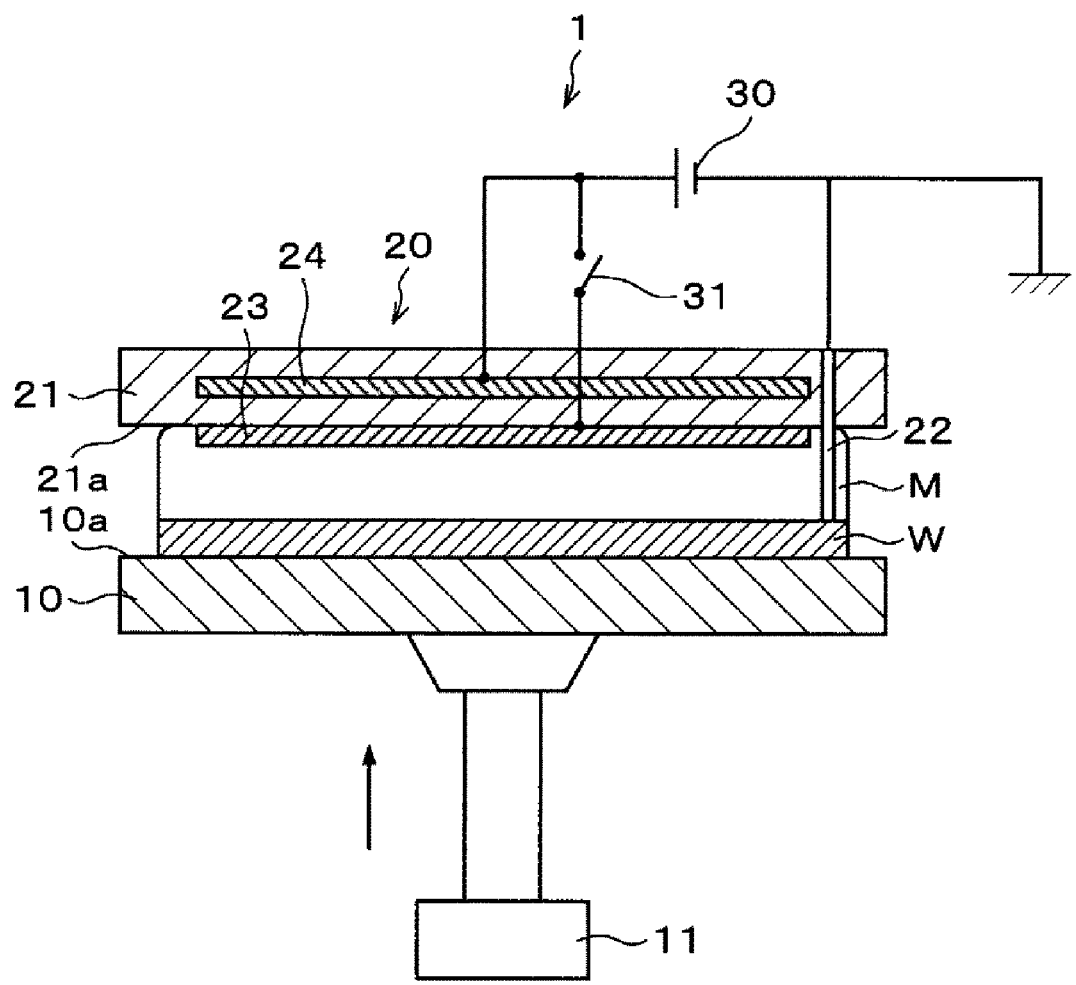
FIG. 3 is a diagram illustrating a state in which a terminal is brought into contact with the wafer and a direct electrode is brought into contact with the plating liquid on the wafer.

Afterwards, as illustrated in FIG. 3, the wafer holding unit 10 is lifted up by the driving mechanism 11. At this time, the distance between the surface 10a of the wafer holding unit 10 and the surface 21a of the main body 21 of the electrolytic processing unit 20 is set to be about 1 mm. Then, the terminals 22 are brought into contact with the wafer W, and the direct electrode 23 is brought into contact with the plating liquid M on the wafer W. At this time, as the terminals 22 have the elasticity, the distance between the surfaces 10a and 21a in the plating liquid M can be adjusted by adjusting a height of the terminals 22. Then, by applying a preset weight of, e.g., 80 g to each terminal 22, an electric contact point is made between the terminal 22 and the wafer W. By applying the weight in this way, it is possible to make an electric contact point for a thin film such as an oxide film or a material in which a contact point is difficult to make.

Figure 4:
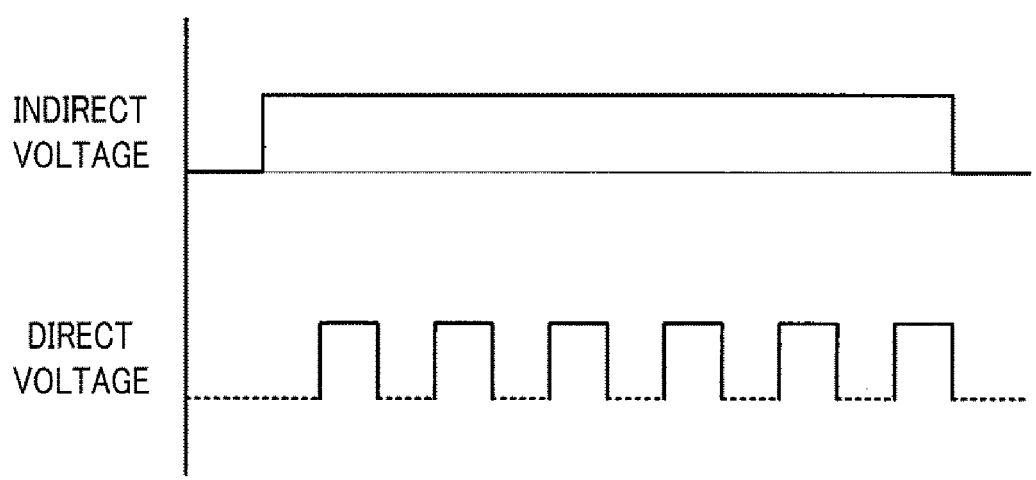
FIG. 4 is a graph showing a state in which a DC voltage is applied between the direct electrode and the wafer in a pulse shape while a DC voltage is being continuously applied between an indirect electrode and the wafer.

As depicted in FIG. 4, while applying a DC voltage continuously between the indirect electrode 24 and the wafer W, the DC voltage is applied between the direct electrode 23 and the wafer W in a pulse shape, that is, a so-called pulse voltage is applied. Here, the pulse voltage is controlled for each of the eight terminals 22.

Figure 5:
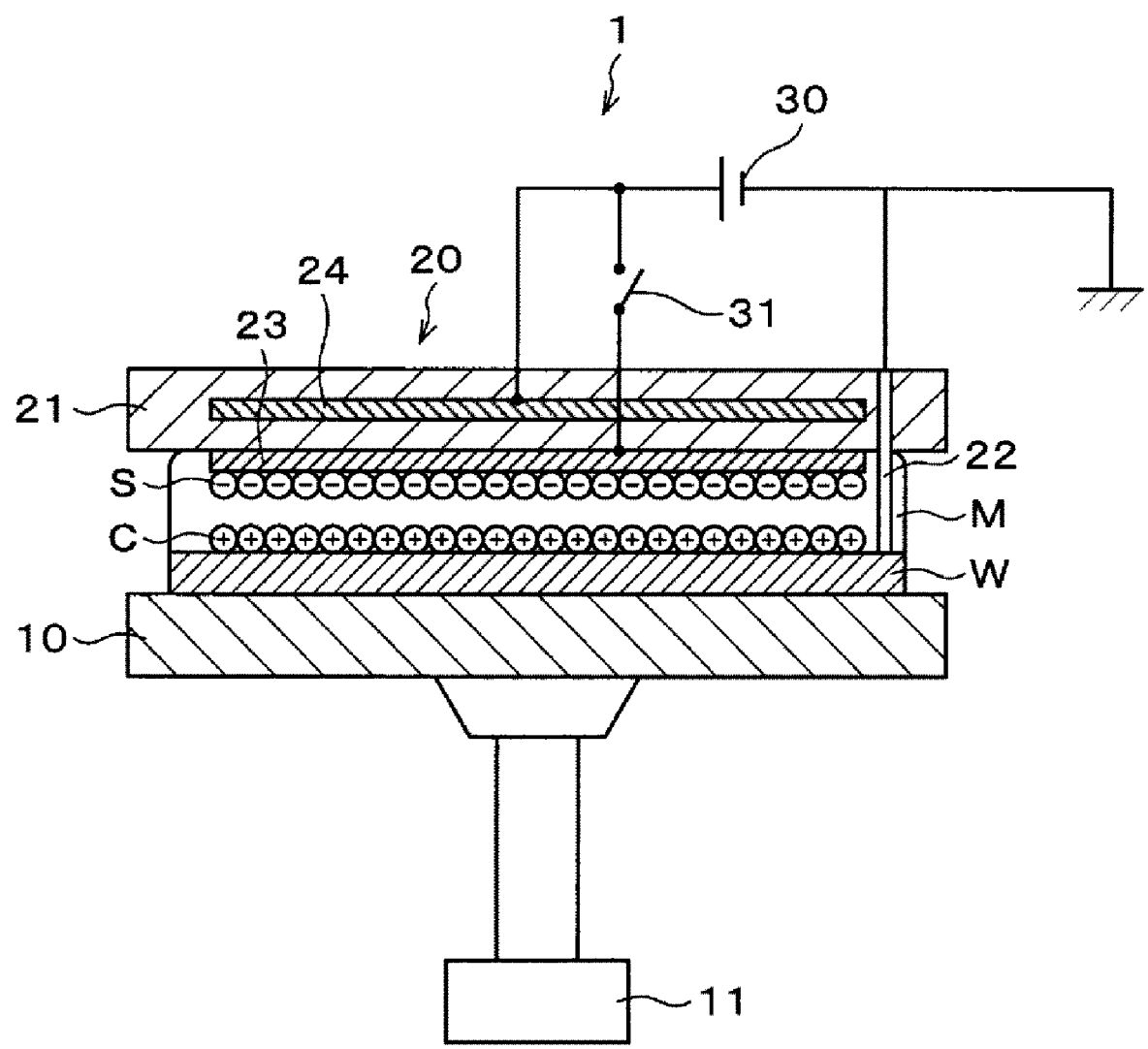
FIG. 5 is a diagram illustrating a state in which a voltage is applied between the indirect electrode and the wafer.

To elaborate, as illustrated in FIG. 5, by applying the DC voltage while using the direct electrode 24 as an anode and the wafer W as a cathode, an electric field (electrostatic field) is formed. As a result, sulfuric acid ions S, which are negatively charged particles, are gathered at a side of the surface (the indirect electrode 24 and the direct electrode 23) of the electrolytic processing unit 20, and copper ions C, which are positively charged particles, are moved to a side of the surface of the wafer W.

At this time, by setting the switch 31 to be in an off-state, the direct electrode 23 is set in an electrically floating state.

In this situation, since charge exchange does not take place at any of the surfaces of the electrolytic processing unit 20 and the wafer W, the electrically charged particles attracted by the electrostatic field are arranged on the surface of the electrode. As depicted in FIG. 5, the copper ions C are uniformly arranged on the surface of the wafer W. Since the charge exchange of the copper ions C does not occur on the surface of the wafer W, electrolysis of water is suppressed. As a result, the electric field can have higher intensity when the voltage is applied between the indirect electrode 24 and the wafer W. Further, since the movement of the copper ions C is accelerated by this high-intensity electric field, a plating rate of the plating processing can be improved. Further, by controlling this electric field as required, the cooper ions C arranged on the surface of the wafer W are also controlled as required.

Furthermore, in the present exemplary embodiment, to avoid the direct electrode 23 from becoming the cathode, the direct electrode 23 is not grounded but set in the electrically floating state.

Figure 6:
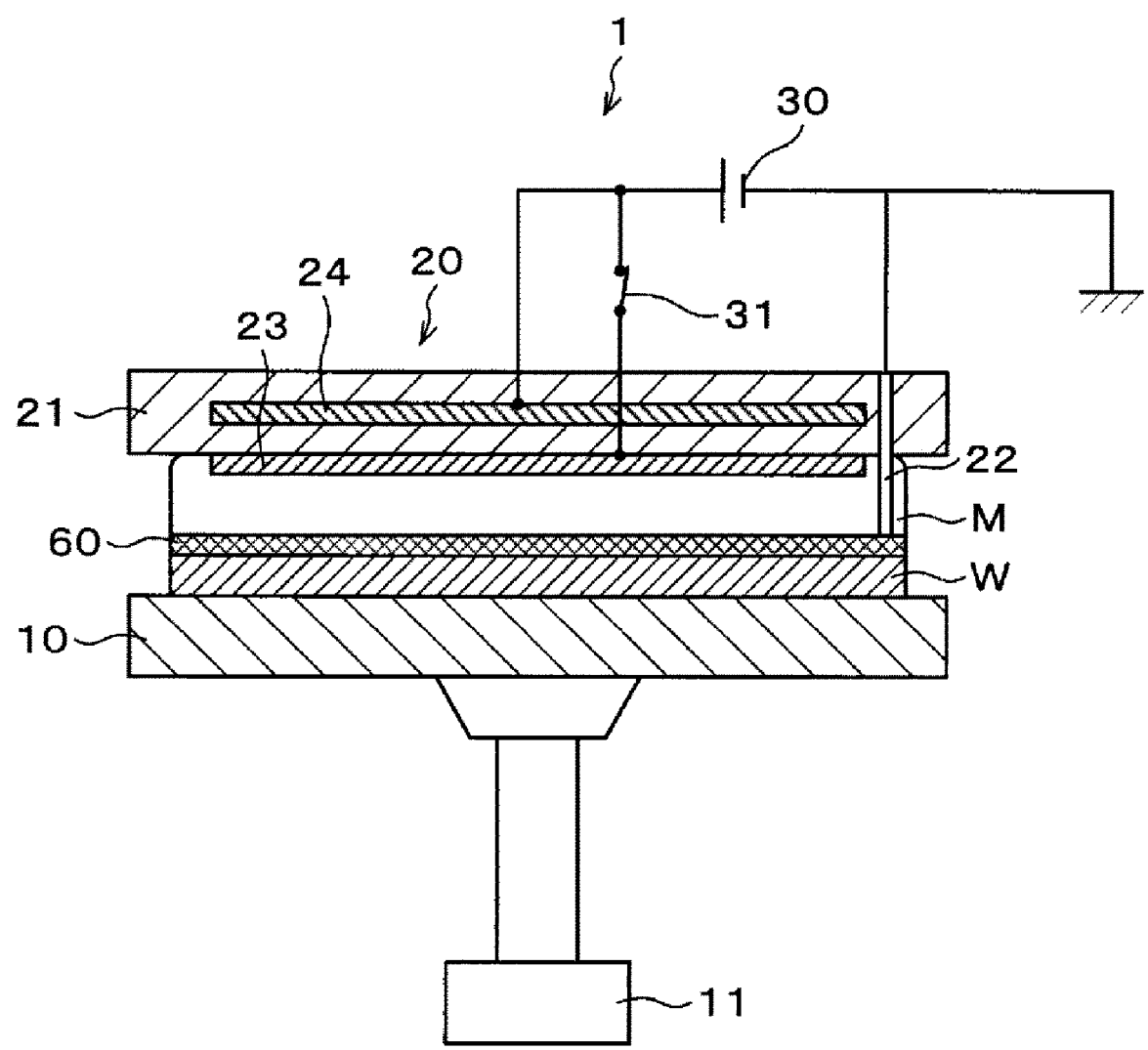
FIG. 6 is a diagram illustrating a state in which the voltage is applied between the direct electrode and the wafer.

Thereafter, if the copper ions C are moved to be accumulated at the wafer W side sufficiently, the switch 31 becomes on, as illustrated in FIG. 6. Then, a voltage is applied while using the direct electrode 23 as an anode and the wafer W as a cathode, so that electric current is flown between the direct electrode 23 and the wafer W. Accordingly, the charge exchange occurs with respect to the copper ions C uniformly arranged on the surface of the wafer W, so that the copper ions C are reduced, so that a copper plating 60 is precipitated on the surface of the wafer W. At this time, the sulfuric acid ions S are oxidized by the direct electrode 23.

Since the copper ions C are sufficiently accumulated on the surface of the wafer W and reduced in the state that they are arranged uniformly, the copper plating 60 can be uniformly precipitated on the surface of the wafer W. As a result, density of crystals of the copper plating 60 is increased, so that the copper plating 60 of a high quality can be formed. Further, since the reduction of the copper ions C is carried out in the state that the copper ions C are uniformly arranged on the surface of the wafer W, the high-quality copper plating 60 can be produced uniformly.

As described above, the supply of the plating liquid M from the nozzle 40, the movement of the copper ions C by the indirect electrode 24, and the reduction of the copper ions C by the direct electrode 23 and the wafer W are repeated, so that the copper plating 60 grows up to a preset film thickness of about 5 µm. Then, the series of the plating processing in the manufacturing apparatus 1 is ended.

According to the above-described exemplary embodiment, since the movement of the copper ions C by the indirect electrode 24 and the reduction of the copper ions C by the direct electrode 23 and the wafer W are performed individually, the reduction of the copper ions C can be performed in the state that the copper ions C are sufficiently and uniformly accumulated on the surface of the wafer W. Thus, the plating processing can be performed on the surface of the wafer W in the uniform manner. Besides, a large-scale device for agitating the plating liquid as in the prior art is not required to improve the uniformity of the plating processing, so that the apparatus configuration can be simplified. Hence, the semiconductor device can be manufactured efficiently and appropriately.

Further, since the wafer W is being rotated when the plating liquid M is supplied onto the wafer W, the film thickness of the plating liquid M on the wafer W can be uniformed within the surface of the wafer W. Thus, the plating processing on the surface of the wafer W can be performed more uniformly. Moreover, the plating liquid M is diffused on the wafer W by the surface tension even when the rotation of the wafer W is not performed. However, the film thickness of the plating liquid M can be further uniformed by rotating the wafer W as in the present exemplary embodiment.

Furthermore, after the plating liquid M is supplied onto the wafer W, the wafer holding unit 10 is raised by the driving mechanism 11, and the terminals 22 are brought into contact with the wafer W, and the direct electrode 23 is brought into contact with the plating liquid M on the wafer W. In this way, the positions of the terminals 22, the direct electrode 23 and the indirect electrode 24 can be adjusted at the same time, so that the series of the processings can be performed efficiently.

Further, to apply a DC voltage while using the wafer W as the cathode, it may be considered to connect a power supply to the wafer W, for example. In such a case, however, it is difficult to rotate the wafer W because a wiring connected to the power supply or the like becomes a hindrance. According to the present exemplary embodiment, however, since the wafer W can be used as the cathode just by bringing the terminals 22 into contact with the wafer W, the rotation of the wafer W is not hampered. Thus, the rotation of the wafer W can be performed easily.

Further, as stated above, since the amount of the copper ions C on the wafer W is determined by adjusting the film thickness of the plating liquid M, the film thickness of the copper plating 60 can be adjusted. In the present exemplary embodiment, the supply of the plating liquid M, the movement and accumulation of the copper ions C and the reduction of the copper ions C are repeated. By adjusting the film thickness of the plating liquid M, however, the copper plating 60 of the preset film thickness can be formed by performing the supply of the plating liquid M, the movement and accumulation of the copper ions C and the reduction of the copper ions C only a single time.

Furthermore, to adjust the film thickness of the copper plating 60, the film thickness of the plating liquid M can be adjusted to be small. Thus, the use efficiency of the plating liquid M is high, so that the consumption amount of the plating liquid M can be reduced.

In the manufacture of the semiconductor device, various liquid processings may be performed before and after the plating processing. For example, when performing a cleaning processing prior to the plating processing, a cleaning liquid such as DIW or IPA is supplied onto the wafer. In such a case, the cleaning liquid on the wafer W needs to be replaced with the plating liquid M after the cleaning processing. According to the present exemplary embodiment, the cleaning liquid can be scattered away by rotating the wafer W. In this regard, the rotation of the wafer W is effective in replacing the processing liquid on the wafer W.

Figure 7:
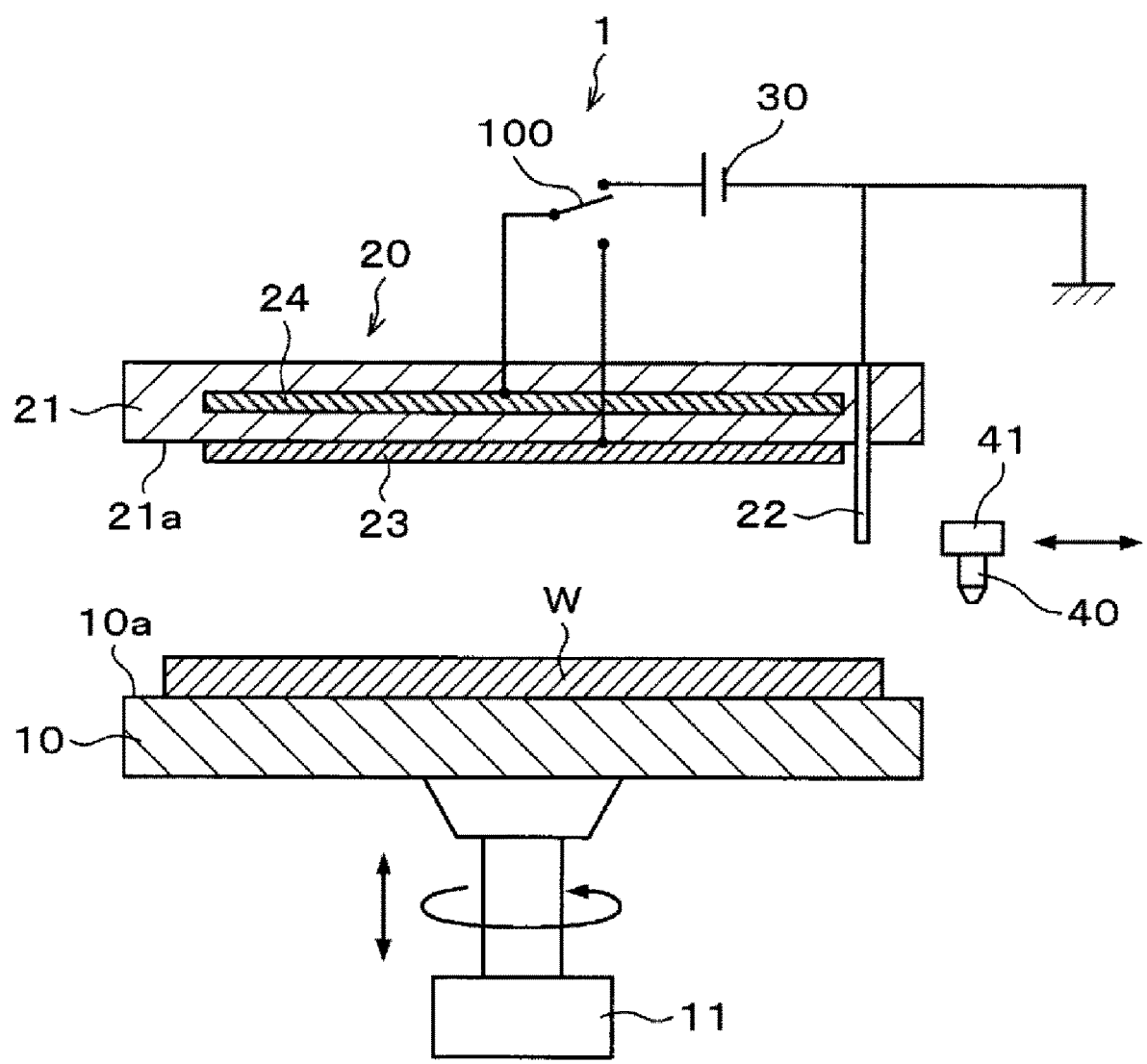
FIG. 7 is a diagram illustrating a schematic configuration of a manufacturing apparatus for a semiconductor device according to another exemplary embodiment.

Now, another exemplary embodiment of the manufacturing apparatus 1 will be explained. In the manufacturing apparatus 1 shown in FIG. 1, the switch 31 is configured to switch the connection state between the direct electrode 23 and the DC power supply 30. However, the configuration of the switch is not limited thereto. By way of example, as depicted in FIG. 7, the indirect electrode 24 may be provided with a switch 100. The switch 100 is configured to perform a switchover between a connection of the indirect electrode 24 with the DC power supply 30 and a connection of the indirect electrode 24 with the direct electrode 23. The switchover of the switch 100 is controlled by the control unit 50. Further, the other configuration of the manufacturing apparatus 1 shown in FIG. 7 is the same as that of the manufacturing apparatus 1 shown in FIG. 1.

Figure 8:
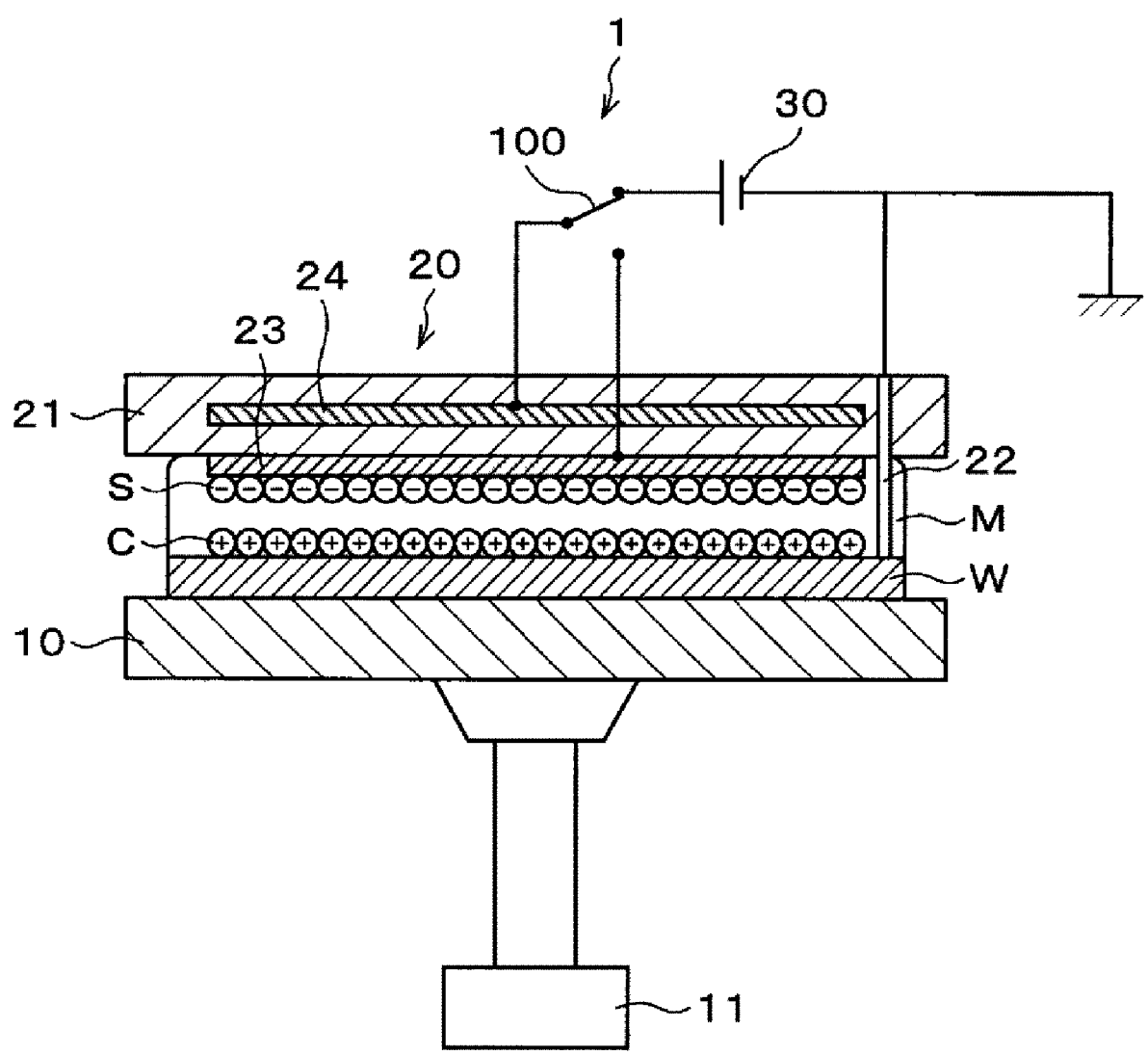
FIG. 8 is a diagram illustrating a state in which a voltage is applied between the indirect electrode and the wafer.

In this configuration, as shown in FIG. 8, a liquid puddle of the plating liquid M is formed on the wafer W, and the terminals 22 are brought into contact with the wafer W and the direct electrode 23 is brought into contact with the plating liquid M on the wafer W. Thereafter, the indirect electrode 24 and the DC power supply 30 are connected by the switch 100. Then, while using the indirect electrode 24 as an anode and the wafer W as a cathode, a DC voltage is applied, so that an electric field (electrostatic field) is formed. As a result, positive charges are accumulated in the indirect electrode 24, and sulfuric acid ions S as negatively charged particles are gathered at the surface side of the electrolytic processing unit 20. Meanwhile, negative charges are accumulated in the wafer W, and copper ions C as positively charged particles are moved to the surface side of the wafer W. In the following description, this state in which the indirect electrode 24 and the DC power supply 30 are connected by the switch 100 and the charges are accumulated in the indirect electrode 24 may sometimes be referred to as "charging."

Furthermore, in order to avoid the direct electrode 23 from becoming the cathode, the direct electrode 23 is not grounded but set in an electrically floating state. In this state, since the charge exchange does not take place at any of the surfaces of the direct electrode 23 and the wafer W, the electrically charged particles attracted by the electrostatic field are arranged on the surface of the electrode.

The connection between the indirect electrode 24 and the DC power supply 30 by the switch 100 is maintained until the electric charges are sufficiently accumulated in the indirect electrode 24 and the wafer W, that is, until the indirect electrode 24 and the wafer W are fully charged. If so, the copper ions C are uniformly arranged on the surface of the wafer W. Since the charge exchange of the copper ions C do not take place on the surface of the wafer W, electrolysis of water is suppressed, so that the electric field can have higher intensity when the voltage is applied between the indirect electrode 24 and the wafer W. The movement of the copper ions C can be accelerated due to the high electric field. Moreover, by controlling this electric field as required, the copper ions C arranged on the surface of the wafer W can also be controlled as required.

Figure 9:
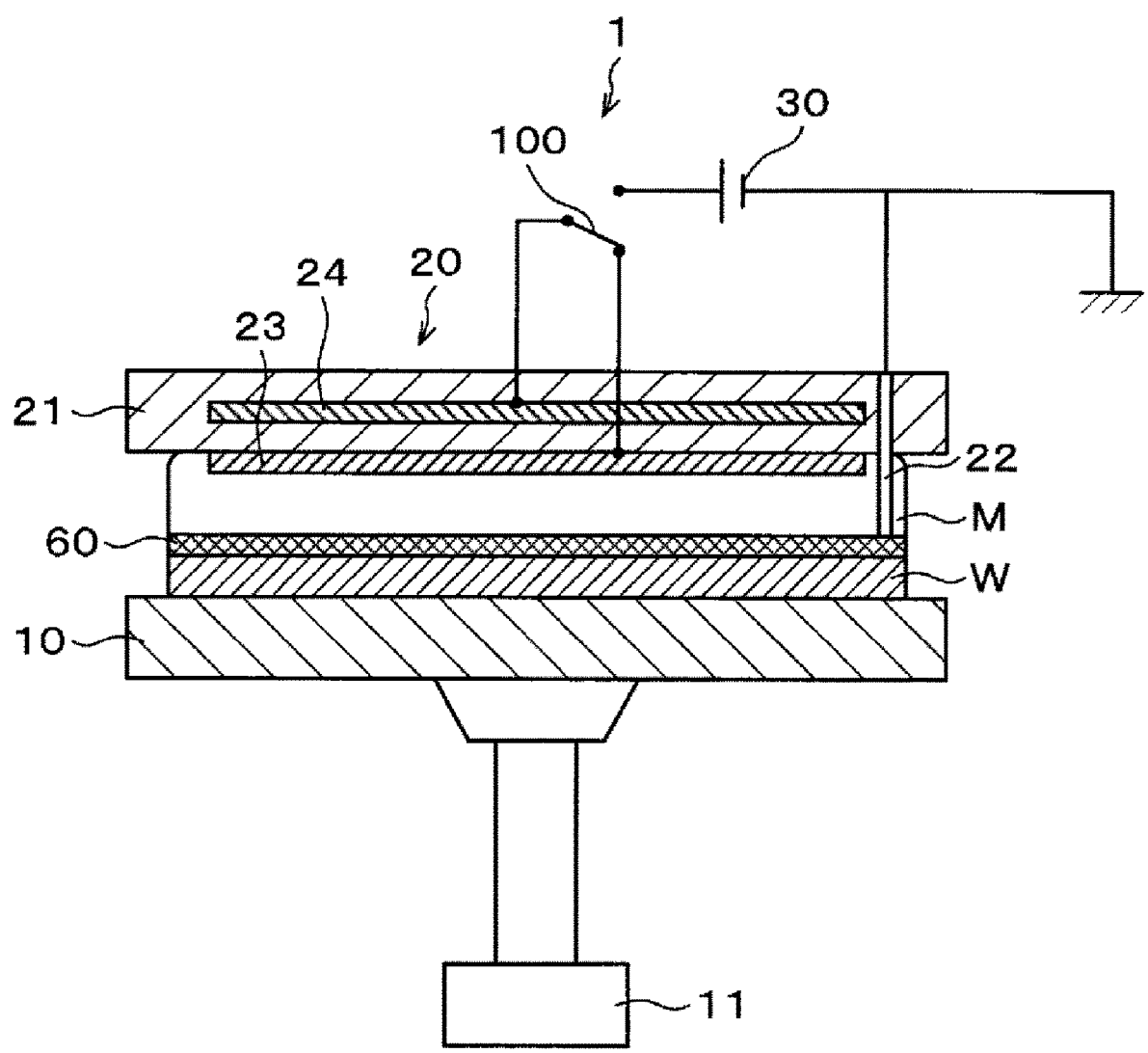
FIG. 9 is a diagram illustrating a state in which a voltage is applied between the direct electrode and the wafer.

Thereafter, as depicted in FIG. 9, the switch 100 is switched over to disconnect the indirect electrode 24 from the DC power supply 30, and to connect the indirect electrode 24 and the direct electrode 23. Accordingly, the positive charges accumulated in the indirect electrode 24 are moved to the direct electrode 23, and charges of the sulfuric acid ions S gathered at the surface side of the electrolytic processing unit 20 are exchanged, so that the sulfuric acid ions S are oxidized. Accordingly, the charges of the copper ions C arranged on the surface of the wafer W are exchanged, so that the copper ions C are reduced. As a result, the copper plating 60 is precipitated on the surface of the wafer W. In the following description, this state in which the indirect electrode 24 and the direct electrode 23 are connected by the switch 100 and the charges are moved from the indirect electrode 24 may sometimes be referred to as "discharging."

Since the copper ions S are sufficiently accumulated on the surface of the wafer W and reduced in the state that they are arranged uniformly, the copper plating 60 can be uniformly precipitated on the surface of the wafer W. As a result, density of crystals of the copper plating 60 is increased, so that the copper plating 60 of a high quality can be formed. Further, since the reduction is carried out in the state that the copper ions C are uniformly arranged on the surface of the wafer W, the high-quality copper plating 60 can be produced uniformly.

As described above, the supply of the plating liquid M from the nozzle 40, the movement and accumulation of the copper ions C during the charging and the reduction of the copper ions C during the discharging are repeated, so that the copper plating 60 grows up to a preset film thickness of about 5 µm. Then, the series of the plating processing in the manufacturing apparatus 1 is ended.

In the present exemplary embodiment, the same effects as those obtained in the aforementioned exemplary embodiment can be achieved. That is, the plating processing can be uniformly performed on the surface of the wafer W by using the manufacturing apparatus 1 having the simple configuration.

Furthermore, the same effects as those of the present exemplary embodiment can be achieved by applying the pulse voltage from a pulse power supply instead of using the switch 100 and the DC power supply 30.

Figure 10:
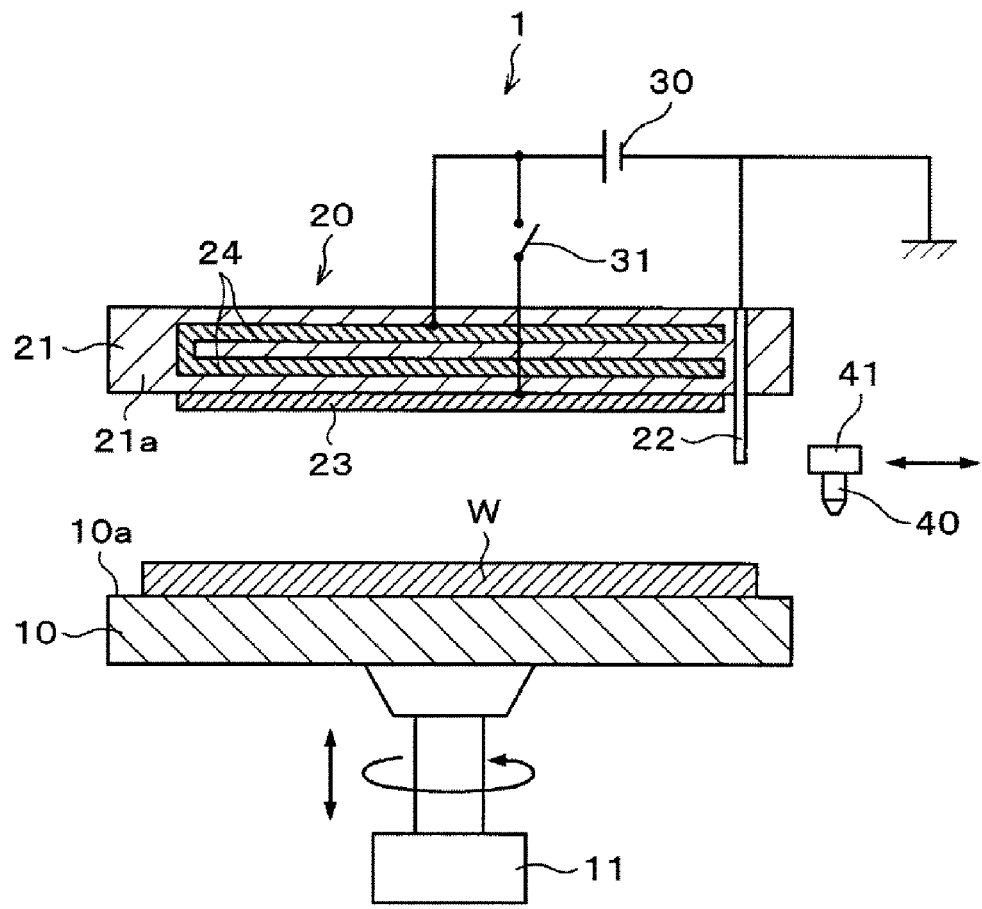
FIG. 10 is a diagram illustrating a schematic configuration of a manufacturing apparatus for a semiconductor device according to yet another exemplary embodiment.
Figure 11A:
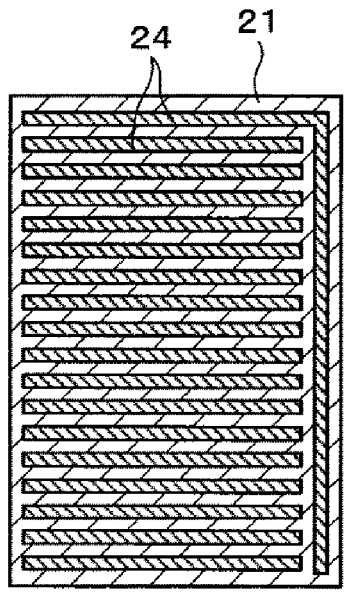
FIG. 11A to FIG. 11C are diagrams each illustrating a state in which indirect electrodes are stacked.
Figure 11B:
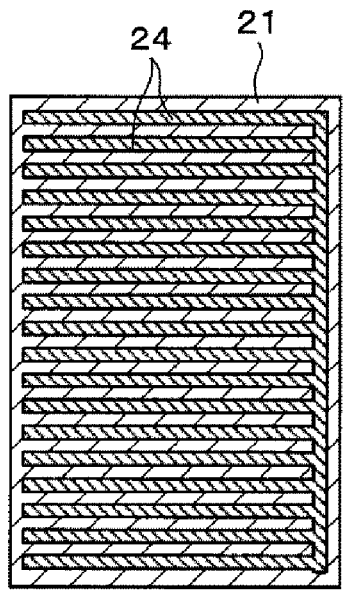
Figure 11C:
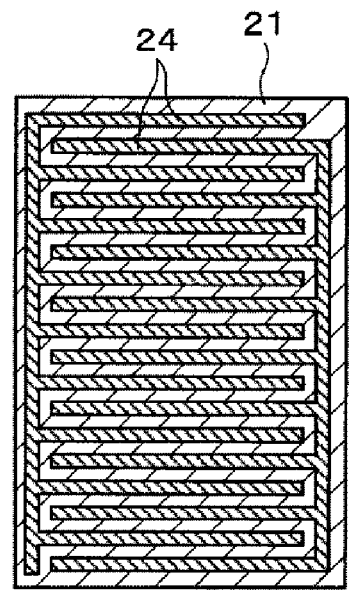

Now, yet another exemplary embodiment of the manufacturing apparatus 1 will be described. As depicted in FIG. 10, in the electrolytic processing unit 20, multiple indirect electrodes 24 may be stacked within the main body 21. The indirect electrodes 24 may be stacked in various ways. That is, individual indirect electrodes 24 may be provided in multiple levels, as shown in FIG. 11A; indirect electrodes 24 may be arranged in a comb-tooth shape, as shown in FIG. 11B; or two comb-teeth-shaped indirect electrodes 24 may be alternately arranged, as shown in FIG. 11C.

According to the present exemplary embodiment, a capacity of the indirect electrodes 24 may be set to be large. Accordingly, a concentration of the cooper ions C accumulated on the surface of the wafer W can be increased. If the concentration of the copper ions C is increased, the charge exchange of the copper ions C can be performed in the state that the copper ions C are sufficiently accumulated on the surface of the wafer W, so that a plating rate of the plating processing can be improved. Besides, since the charge exchange of the copper ions C is performed in the state that the copper ions C are uniformly arranged on the surface of the wafer W, the uniformity of the plating processing can be improved.

In addition, in this exemplary embodiment as well, the switch 100 shown in FIG. 7 may be used instead of the switch 31.

Now, still yet another exemplary embodiment of the manufacturing apparatus 1 will be explained. Though the main body 21 of the electrolytic processing unit 20 shown in FIG. 1 is equipped with the terminals 22, the direct electrode 23 and the indirect electrode 24, the main body 21 shown in FIG. 12 may be equipped with terminals 110, a common electrode 111 and a capacitor 112.

Each terminal 110 has the same configuration as the terminal 22. That is, the terminal 110 is held at the main body 21 while being protruded from the surface 21a of the main body 21. Further, the terminal 110 has elasticity.

The common electrode 111 is provided at the surface 21a of the main body 21. When the plating processing is performed, the common electrode 111 comes into contact with the plating liquid M on the wafer W. Further, the common electrode 111 has a function of the direct electrode 23 and a function of the indirect electrode 24 of the above-described exemplary embodiments.

The terminal 110 and the common electrode 111 are connected to a DC power supply 120. The terminal 110 is connected to a cathode side of the DC power supply 120, while the common electrode 111 is connected to an anode side of the DC power supply 120.

A first wiring 121 and a second wiring 122 are connected to the common electrode 111. The first wiring 121 is provided with the capacitor 112. The capacitor 112 may be provided within the main body 21 as the insulator, or may be provided at an outside of the main body 21 while being covered with an insulator. The second wiring 122 is provided with a switch 123. An on/off operation of the switch 123 is controlled by the control unit 50.

Figure 12:
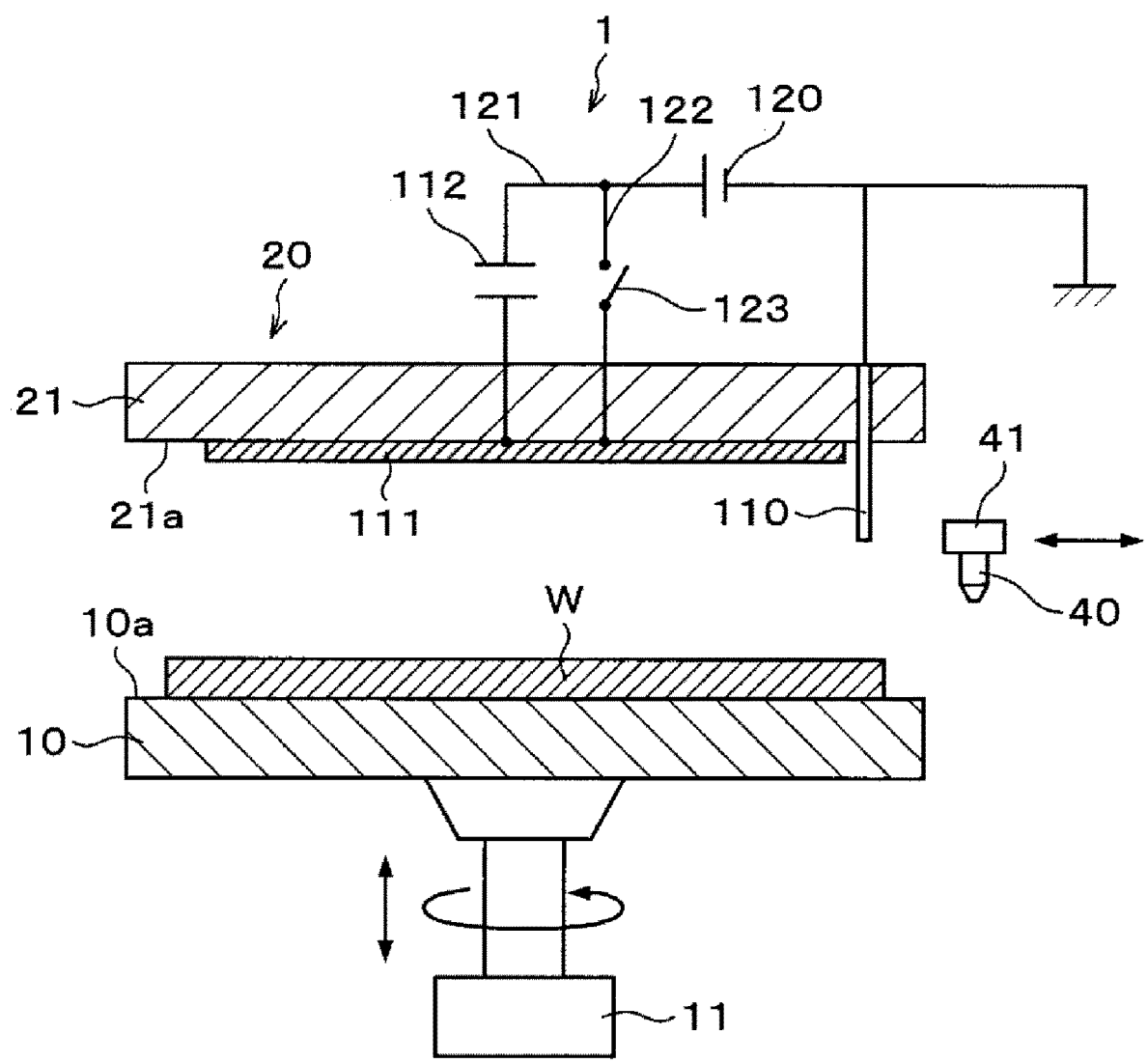
FIG. 12 is a diagram illustrating a schematic configuration of a manufacturing apparatus for a semiconductor device according to still yet another exemplary embodiment.

When the switch 123 is in an on-state, the common electrode 111 and the DC power supply 120 are connected, and electric current flows between the common electrode 111 and the terminals 110. Further, when the switch 123 is in an off-state, the common electrode 111 and the DC power supply 120 are disconnected from each other, so that no current flows between the common electrode 111 and the DC power supply 120. Further, the other configuration of the manufacturing apparatus 1 shown in FIG. 12 is the same as that of the manufacturing apparatus 1 shown in FIG. 1.

Figure 13:
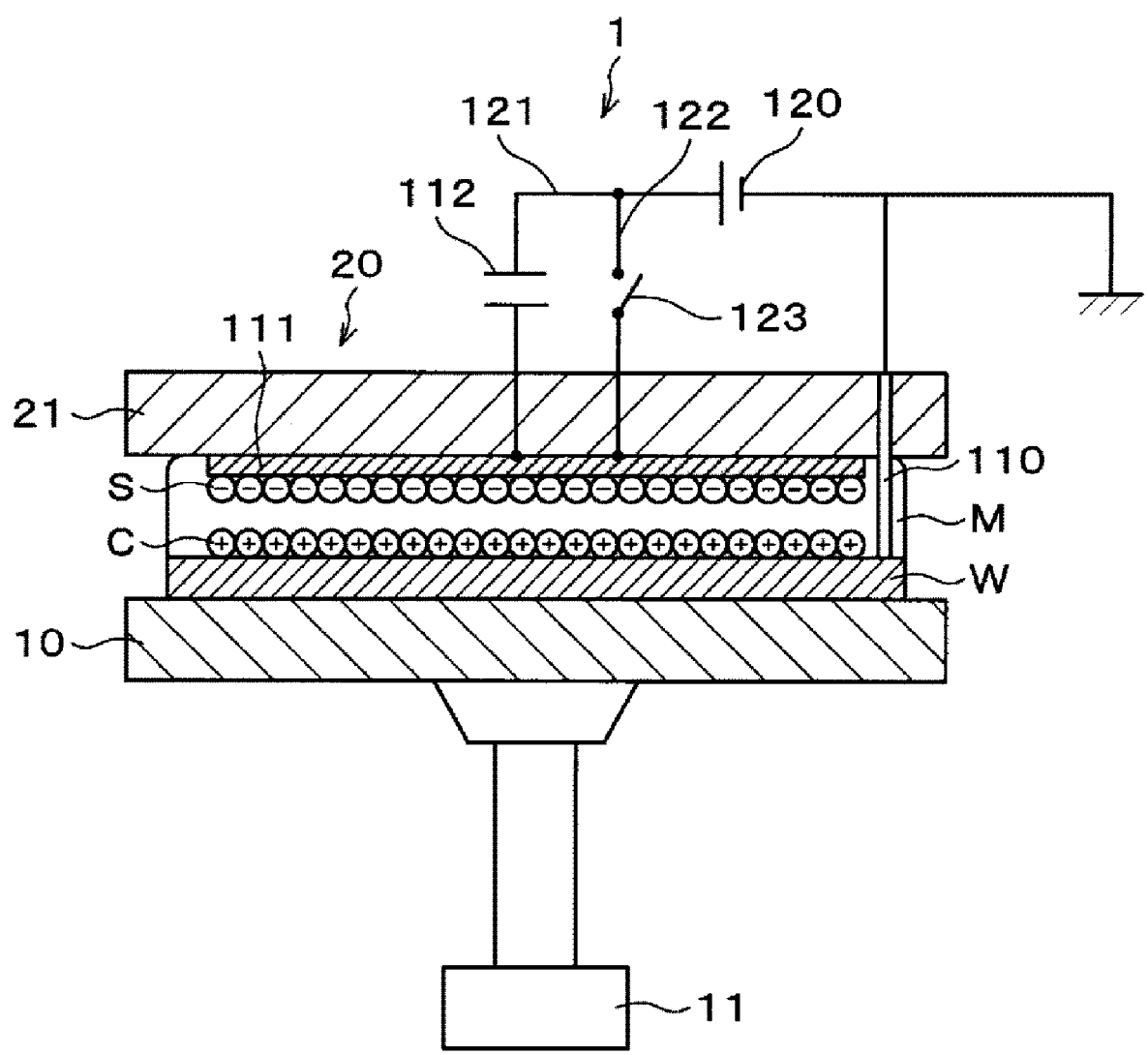
FIG. 13 is a diagram illustrating a state in which a capacitor is charged.

According to the present exemplary embodiment, a liquid puddle of the plating liquid M is formed on the wafer W as illustrated in FIG. 13, and the terminals 110 are brought into contact with the wafer W and the common electrode 111 is brought into contact with the plating liquid M on the wafer W. At this time, by applying a preset weight of, e.g., 7 kg to each terminal 110, an electric contact point is made between the terminal 110 and the wafer W. By applying the weight in this way, it is possible to make an electric contact point for a thin film such as an oxide film or a material in which a contact point is difficult to make.

Then, as depicted in FIG. 4, while applying a DC voltage continuously between the common electrode 111 and the wafer W via the first wiring 121 and the terminals 110, a DC voltage is applied between the common electrode 111 and the wafer W via the second wiring 122 and the terminals 110 in a pulse shape, that is, a so-called pulse voltage is applied.

To elaborate, as illustrated in FIG. 13, by applying the DC voltage continuously between the common electrode 111 and the wafer W via the first wiring 121 and the terminals 110, the capacitor 112 is charged. That is, positive charges are accumulated at a side of the common electrode 111 of the capacitor 112, and negative charges are accumulated at a side of the DC power supply 120 of the capacitor 112. Further, an electric field (electrostatic field) is formed in the plating liquid M. As the positive charges are accumulated in the common electrode 111, sulfuric acid ions S which are negatively charged particles are gathered to the common electrode 111 side. Meanwhile, the negative charges are accumulated in the wafer W, so that copper ions C which are positively charged particles are moved to the wafer W side.

Figure 14:
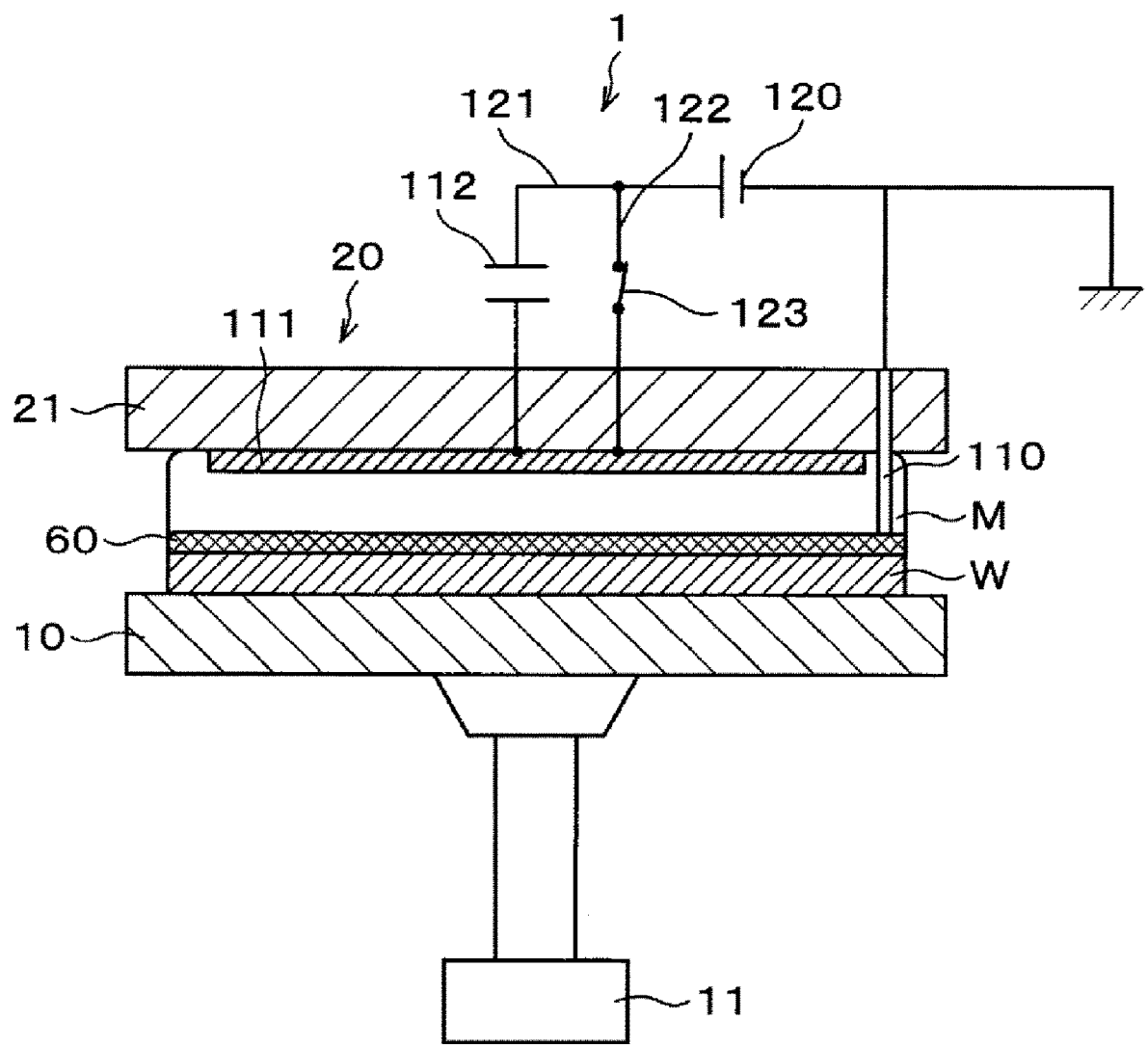
FIG. 14 is a diagram illustrating a state in which the capacitor is discharged.

Thereafter, if the copper ions C are moved to be accumulated on the wafer W side sufficiently, the switch 123 becomes on, as illustrated in FIG. 14. Then, a DC voltage is applied in a pulse shape between the common electrode 111 and the wafer W via the second wiring 122 and the terminals 110. By applying the voltage while using the common electrode 111 as an anode and the wafer W as a cathode, electric current is flown between the common electrode 111 and the wafer W. Further, the positive charges accumulated at the common electrode 111 side of the capacitor 112 after being discharged from the capacitor 112 are moved to the common electrode 111, and charges of the sulfuric acid ions S gathered at the common electrode 111 side are exchanged, so that the sulfuric acid ions S are oxidized. Accordingly, charges of the coppers ions C arranged on the surface of the wafer W are exchanged, so that the copper ions C are reduced. Then, the copper plating 60 is precipitated on the surface of the wafer W.

Since the copper ions C are sufficiently accumulated on the surface of the wafer W and reduced in the state that they are arranged uniformly, the copper plating 60 can be uniformly precipitated on the surface of the wafer W. As a result, density of crystals of the copper plating 60 is increased, so that the copper plating 60 of a high quality can be formed. Further, since the reduction is carried out in the state that the copper ions C are uniformly arranged on the surface of the wafer W, the high-quality copper plating 60 can be produced uniformly.

As described above, the supply of the plating liquid M from the nozzle 40, the movement and accumulation of the copper ions C during the charging and the reduction of the copper ions C during the discharging are repeated, the copper plating 60 grows up to a preset film thickness of about 5 µm. Then, the series of the plating processings in the manufacturing apparatus 1 is ended.

According to the present exemplary embodiment, the same effects as those obtained in the aforementioned exemplary embodiments can be achieved. That is, the plating processing can be uniformly performed on the surface of the wafer W by using the manufacturing apparatus 1 having the simple configuration. Further, by setting the capacitance of the capacitor 112 to be large, the concentration of the cooper ions C accumulated on the surface of the wafer W can be increased, so that the plating rate of the plating processing can be increased and the uniformity of the plating processing can be improved.

Figure 15:
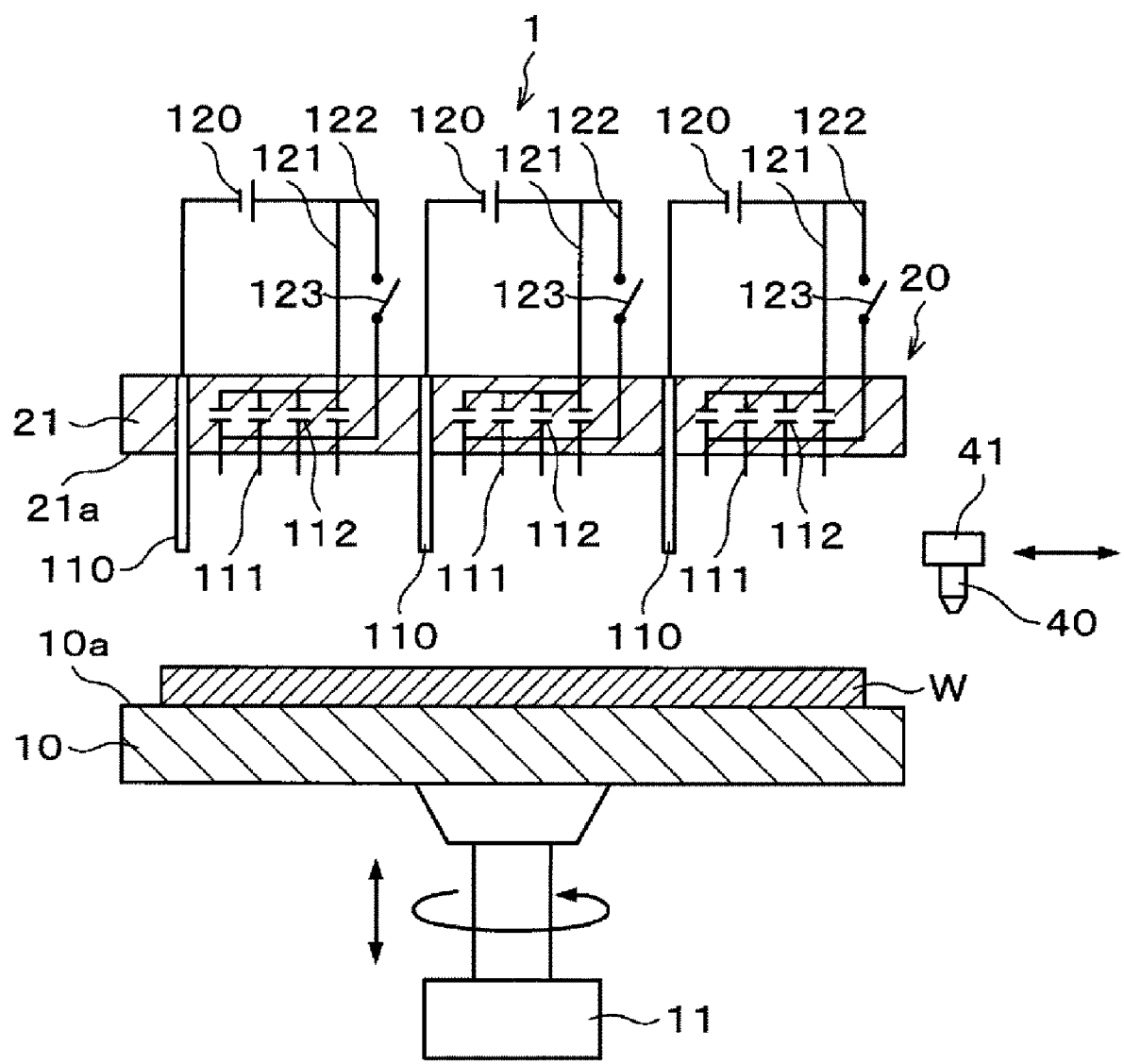
FIG. 15 is a diagram illustrating a schematic configuration of a manufacturing apparatus for a semiconductor device according to still yet another exemplary embodiment.

In the above-described present exemplary embodiment, as shown in FIG. 15, the number of a circuit composed of the terminals 110, the common electrode 111, the capacitor 112, the DC power supply 120, the wirings 121 and 122 and the switch 123 may be plural. For example, 700 circuits may be provided. The number of these circuits correspond to the number of chips formed on the wafer W. That is, the terminals 110, which are brought into contact with the wafer W when the plating processing is performed, are brought into contact with seed layers of the individual chips.

Further, the number of the common electrode 111 and the capacitor 112 provided on a single circuit may be plural. That is, a plurality of common electrodes 111 and a plurality of capacitors 112 may be provided for every single terminal 110. Furthermore, the capacitor 112 may be provided within the main body 21 as the insulator, or may be provided at an outside of the main body 21 while being covered with an insulator.

In such a configuration, the capacitance of the capacitor 112 can be further increased. Accordingly, the concentration of the copper ions C accumulated on the surface of the wafer W can be further increased, so that a plating rate of the plating processing can be increased, and the uniformity of the plating processing can be improved.

Moreover, in the present exemplary embodiment, the circuits are provided to respectively correspond to each chip of the wafer W. Here, it may be possible to control the voltages applied to the circuits individually. By way of example, by controlling different voltages to be applied to a central portion of the wafer W and a peripheral portion thereof, the plating processing can be performed uniformly within the surface of the wafer. Further, the film thickness of the copper plating 60 can be uniformed within the surface of the wafer.

Now, still yet another exemplary embodiment of the manufacturing apparatus 1 will be explained. The wafer holding unit 10 shown in FIG. 1 is implemented by the spin chuck. A wafer holding unit 130 shown in FIG. 16, however, is equipped with a vessel 131 having an open top, and the wafer W is held within the vessel 131 and the plating liquid M is stored therein.

The wafer holding unit 130 is equipped with a driving mechanism 132 having an elevation driving source such as a cylinder. The vessel 131 is configured to be movable in the vertical direction by the driving mechanism 132. Further, in the present exemplary embodiment, the driving mechanism 132 constitutes the moving mechanism of the present disclosure.

Figure 16:
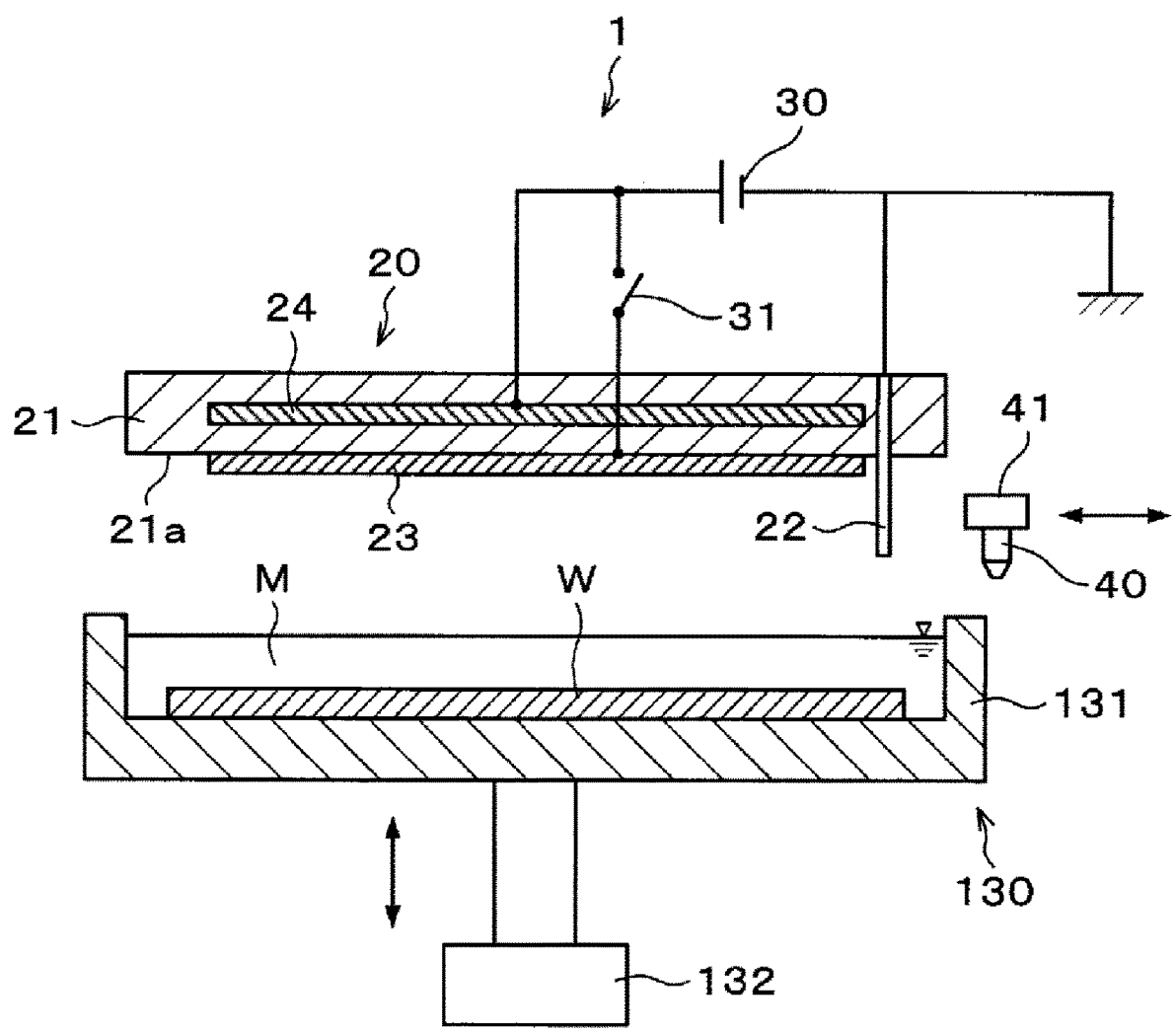
FIG. 16 is a diagram illustrating a schematic configuration of a manufacturing apparatus for a semiconductor device according to still yet another exemplary embodiment.

Further, the other configuration of the manufacturing apparatus 1 shown in FIG. 16 is the same as that of the manufacturing apparatus 1 shown in FIG. 1.

In this configuration, while holding the wafer W within the vessel 131, the plating liquid M is supplied from the nozzle 40 into the vessel 131. Then, the plating processing is performed on the wafer W.

In the present exemplary embodiment, the same effects as obtained in the above-described exemplary embodiments can be achieved. That is, the plating processing can be uniformly performed on the surface of the wafer W by using the manufacturing apparatus 1 having the simple configuration. Further, since a large amount of plating liquid M can be stored in the vessel 131, the present exemplary embodiment is advantageous when a target film thickness of the copper plating 60 is large, for example.

Figure 17:
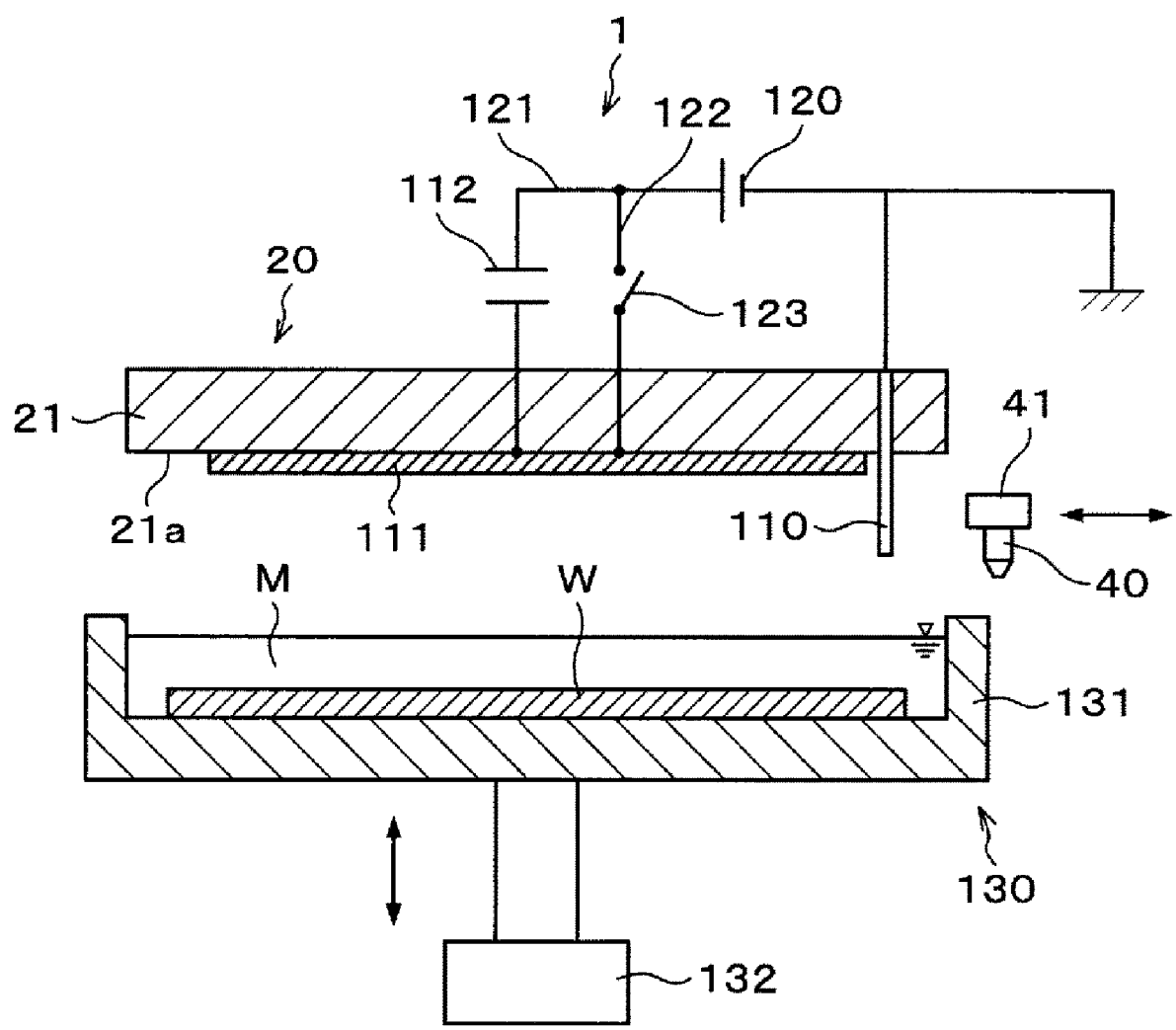
FIG. 17 is a diagram illustrating a schematic configuration of a manufacturing apparatus for a semiconductor device according to still yet another exemplary embodiment.

As depicted in FIG. 17, the aforementioned wafer holding unit 130 may be applied to the manufacturing apparatus 1 shown in FIG. 12. In this exemplary embodiment, the same effects as those of the above-described exemplary embodiments can also be achieved.

In the above-described exemplary embodiments, in the manufacturing apparatus 1, the wafer holding unit 10 (wafer holding unit 130) is moved by the driving mechanism 11 (driving mechanism 132). However, the electrolytic processing unit 20 may be moved instead, or both the wafer holding unit 10 (wafer holding unit 130) and the electrolytic processing unit 20 may be moved.

The above various exemplary embodiments have been described for the case where the plating processing is performed as the electrolytic processing. However, the exemplary embodiments are also applicable to various other types of electrolytic processings such as, by way of example, etching processing.

Moreover, the above exemplary embodiments have been described for the case where the copper ions C are reduced on the surface side of the wafer W. However, the exemplary embodiments are also applicable to a case where the processing target ions are oxidized on the surface side of the wafer W. In such a case, the processing target ions are negative ions, and the same electrolytic processing as described in the above exemplary embodiments may be performed while setting the anode and the cathode in the reverse way as in the above exemplary embodiments. In this case, the same effects as those of the above-described exemplary embodiments can obtained, though the oxidation and the reduction of the processing target ions are different.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

EXPLANATION OF CODES

1: Manufacturing apparatus
10: Wafer holding unit
11: Driving mechanism
20: Electrolytic processing unit
21: Main body
22: Terminal
23: Direct electrode
24: Indirect electrode
30: DC power supply
31: Switch
40: Nozzle
50: Control unit
60: Copper plating
100: Switch
110: Terminal
111: Common electrode
112: Capacitor
120: DC power supply
123: Switch
130: Wafer holding unit
131: Vessel
132: Driving mechanism
C: Copper ion
M: Plating liquid
S: Sulfuric acid ion
W: Wafer (Semiconductor wafer)

We claim:

1. A manufacturing apparatus for a semiconductor device, comprising:
a substrate holding unit configured to hold a substrate;
a processing liquid supply unit configured to supply a processing liquid onto the substrate held by the substrate holding unit;
an electrolytic processing unit disposed to face the substrate holding unit and configured to perform an electrolytic processing on the substrate held by the substrate holding unit; and
a terminal configured to apply a voltage to the substrate while being in contact with the substrate,
wherein the electrolytic processing unit comprises a main body,
a direct electrode is provided on a surface of the main body and configured to be brought into contact with the processing liquid supplied onto the substrate to apply a voltage with respect to the substrate; and
an indirect electrode is provided within the main body and is configured to form an electric field in the processing liquid supplied onto the substrate,
wherein the terminal is held by the main body and is protruded from the surface of the main body.

2. The manufacturing apparatus for the semiconductor device of claim 1,
wherein the main body is made of an insulator.

3. The manufacturing apparatus for the semiconductor device of claim 2,
wherein the indirect electrode is plural in number, and the indirect electrodes are stacked on top of each other within the main body.

4. The manufacturing apparatus for the semiconductor device of claim 1, further comprising:
   a moving mechanism configured to move the substrate holding unit or the electrolytic processing unit relatively to each other.

5. The manufacturing apparatus for the semiconductor device of claim 1, further comprising:
   a rotating mechanism configured to rotate the substrate holding unit.

6. The manufacturing apparatus for the semiconductor device of claim 1,
   wherein the substrate holding unit is equipped with a vessel having an open top, and
   the substrate is held within the vessel and the processing liquid is stored in the vessel.

7. A manufacturing method for a semiconductor device by using the manufacturing apparatus of claim 1, comprising:
   a first process of placing the substrate holding unit configured to hold the substrate and the electrolytic processing unit configured to perform the electrolytic processing on the substrate held by the substrate holding unit to face each other;
   a second process of supplying the processing liquid from the processing liquid supply unit onto the substrate held by the substrate holding unit;
   a third process of bringing the terminal configured to apply the voltage to the substrate into contact with the substrate and brining the direct electrode belonging to the electrolytic processing unit into contact with the processing liquid;
   a fourth process of forming an electric field in the processing liquid by applying a voltage to the indirect electrode belonging to the electrolytic processing unit to move processing target ions in the processing liquid to a substrate side; and
   a fifth process of oxidizing or reducing the processing target ions moved to the substrate side by applying a voltage between the direct electrode and the substrate, wherein the electrolytic processing unit holds the terminal.

8. The manufacturing method for the semiconductor device of claim 7,
   wherein the main body made of an insulator.

9. The manufacturing method for the semiconductor device of claim 8,
   wherein the indirect electrode is plural in number, and the indirect electrodes are stacked on top of each other within the main body.

10. The manufacturing method for the semiconductor device of claim 7,
    wherein in the third process, the terminal is brought into contact with the substrate by adjusting a height of the terminal.

11. The manufacturing method for the semiconductor device of claim 7,
    wherein, in the third process, the substrate holding unit or the electrolytic processing unit are moved relatively to each other by a moving mechanism.

12. The manufacturing method for the semiconductor device of claim 7,
    wherein, in the second process, the processing liquid is supplied from the processing liquid supply unit onto the substrate held by the substrate holding unit while rotating the substrate holding unit by a rotating mechanism.

13. The manufacturing method for the semiconductor device of claim 7,
    wherein the substrate holding unit is equipped with a vessel having an open top, and
    in the second process, while holding the substrate within the vessel, the processing liquid is supplied and stored into the vessel by the processing liquid supply unit.

* * * * *